(12) United States Patent
Akatsuka

(10) Patent No.: US 6,759,915 B2
(45) Date of Patent: Jul. 6, 2004

(54) MULTI-BAND, VOLTAGE-CONTROLLED OSCILLATOR

(75) Inventor: Terumoto Akatsuka, Ichinomiya (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 199 days.

(21) Appl. No.: 09/936,322

(22) PCT Filed: Jan. 12, 2001

(86) PCT No.: PCT/JP01/00116

§ 371 (c)(1), (2), (4) Date: Jan. 14, 2002

(87) PCT Pub. No.: WO01/52402

PCT Pub. Date: Jul. 19, 2001

(65) Prior Publication Data

US 2002/0158701 A1 Oct. 31, 2002

(30) Foreign Application Priority Data

Jan. 12, 2000 (JP) ........................................ 2000-003284

(51) Int. Cl.⁷ ................................................ H03B 1/00
(52) U.S. Cl. ............... 331/179; 331/177 V; 331/117 R; 331/117 FE; 331/36 C; 331/36 L; 331/167; 331/107 SL; 331/1 A
(58) Field of Search ................................. 331/1 A, 179, 331/117 R, 117 FE, 167, 177 V, 36 C, 107 SL, 36 L; 455/179.1, 180.1, 180.3, 180.4

(56) References Cited

U.S. PATENT DOCUMENTS 5,270,579 A * 12/1993 Maier et al. ............. 455/190.1

FOREIGN PATENT DOCUMENTS

| JP | 50-125659 | 10/1975 |
|----|-----------|---------|
| JP | 61-32603 | 2/1986 |
| JP | 61-113410 | 7/1986 |
| JP | 3-18106 | 1/1991 |
| JP | 4-249409 | 9/1992 |
| JP | 4-329705 | 11/1992 |
| JP | 8-316731 | 11/1996 |
| JP | 9-148888 | 6/1997 |
| JP | 10-51236 | 2/1998 |
| JP | 11-127028 | 5/1999 |
| JP | 11-168324 | 6/1999 |
| JP | 11-298242 | 10/1999 |
| JP | 11-312925 | 11/1999 |

* cited by examiner

Primary Examiner—Arnold Kinkead
(74) Attorney, Agent, or Firm—Wenderoth, Lind & Ponack, L.L.P.

(57) ABSTRACT

A multi-band, voltage-controlled oscillator has a switching device that can be certainly be turned on and off. The oscillator includes a negative source generator coupled to an output of a buffer transistor from which an oscillation frequency of an oscillating transistor is released, a switching device for selectively switching between an output of the negative source generator and a positive power source, and a mode switching device receiving an output frequency switching signal from the outside. An output of the switching device controls an opening and short-circuiting operation of first switching device to selectively release oscillation outputs in a low frequency band and a high frequency band from an output port.

28 Claims, 6 Drawing Sheets

MULTI-BAND, VOLTAGE-CONTROLLED OSCILLATOR

TECHNICAL FIELD

The present invention relates to a multi-band voltage-controlled oscillator used in a mobile communication apparatus.

BACKGROUND ART

As a mobile communication has rapidly spread, a frequency band firstly assigned to it can hardly cover the entire service. Accordingly, an additional band ranging from 1.5 GHz to 2 GHz has now introduced. This requires mobile communication terminals to be compatible with both the frequency bands. Also, as high-frequency semiconductor technologies have significantly advanced, a particular type of a voltage controlled oscillator has been required which can handle at least three different frequency bands for the mobile communication terminals while being formed by a semiconductor integrated circuit.

Such a conventional multi-band voltage-controlled oscillator used in a common mobile communication terminal will be explained. As shown in FIG. 7, the conventional multi-band voltage-controlled oscillator includes a resonant circuit 1 which is switchable between a low frequency band of about 900 MHz and a high frequency band of about 1800 MHz, an oscillator circuit 2 coupled to the resonant circuit 1, a buffer 3 coupled to an output of the oscillator circuit 2, and an output port 4 coupled to an output of the buffer 3. The resonant circuit 1 incorporates a parallel combination of a parallel assembly 7 having a variable-capacitance diode 5 and a capacitor 6 connected in parallel with each other and a serial assembly 10 having inductors 8 and 9 connected in series with each other.

Depending on a controlling voltage supplied from a control port 12, the variable-capacitance diode 5 has the capacitance varied, thus modifying an oscillation frequency continuously. The control port 12 is coupled via a low-pass filter to an output of a PLL circuit.

The switching between two different frequency bands is conducted by a source voltage Vcc or a grounding potential applied to a band switching port 13 to turn on and off an electronic switch 14 connected in parallel with the inductor 9, i.e. both ends of the inductor 9 are short-circuited and disconnected.

More specifically, when a frequency in the high frequency band is oscillated, the electronic switch 14 is turned on to short-circuit between the two ends of the inductor 9. This enables the parallel assembly 7 and the inductor 8 to be connected in parallel with each other and thus to release a frequency of substantially 1800 MHz. Alternatively, when a frequency in the low frequency band is oscillated, the two ends of the inductor 9 are disconnected. This enables the parallel assembly 7 and the serial assembly 10 to be connected in parallel with each other thus releasing a frequency of substantially 900 MHz. Moreover, the oscillator is connected to the PLL circuit as a loop in the mobile communication terminal.

The conventional oscillator allows the electronic switch 14 to be activated with the source voltage Vcc or the grounding potential applied to the band switching port 13. However, particularly when the grounding potential is applied, the potential can hardly present a zero potential to the port, but a small amount of positive potential remaining at the port. This prevents the electronic switch 14 from being completely turned off, thus generating an unstable state. As a result, the oscillation frequency or the thermal characteristics of the oscillator may be inconsistent.

It is an object of the present invention, which solves the problem, to provide a multi-band voltage-controlled oscillator having switching means to be turned on and off securely.

DISCLOSURE OF THE INVENTION

In order to achieve the object of the present invention, a multi-band voltage-controlled oscillator includes a negative source generator coupled to an output of a buffer transistor which delivers an oscillation frequency from an oscillating transistor, second switching means for selectively switching between an output of the negative source generator and a positive source, and mode switching means for receiving an output frequency switching signal received from the outside. At least the oscillating transistor, the buffer transistor, the negative source generator, and the mode switching circuit are integrated into a signal package. Controlling opening and short-circuiting operations of the first switching means with an output of the second switching means provides oscillation outputs in the low frequency band and high frequency band to be released from the output port.

This allows the switching means to be turned on and off securely.

DETAILED DESCRIPTION OF THE INVENTION

Embodiments of the present invention will be described referring to the relevant drawings.

Embodiment 1

Figure 1:
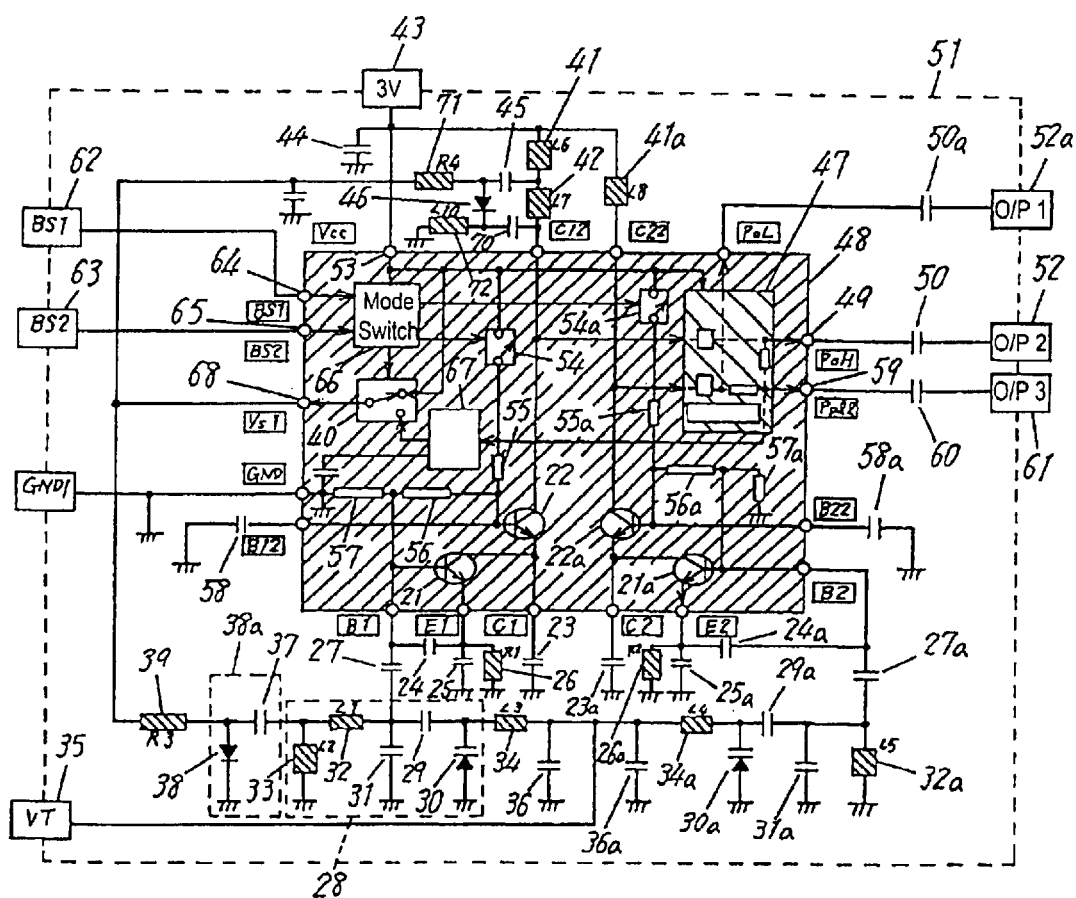
FIG. 1 is a circuit diagram of a multi-band voltage-controlled oscillator according to Embodiment 1 of the present invention.

FIG. 1 is circuit diagram of a multi-band, voltage-controlled oscillator, which employs an unbalanced oscillator, according to Embodiment 1 of the present invention. In FIG. 1, reference numeral 21 denotes an oscillating transistor which is cascade-connected to a buffer transistor 22. Reference numeral 23 denotes a capacitor grounding a collector of the oscillating transistor 21 at a high frequency. Reference numeral 24 denotes a capacitor connected between a base and emitter of the oscillating transistor 21, and reference numeral 25 denotes a capacitor connected between the emitter of the oscillating transistor 21 and the ground (between the emitter and the collector in a high frequency). Reference numeral 26 denotes a resistor connected between the emitter of the oscillating transistor 21 and the ground. A coupling capacitor 27 is connected in series with a resonant circuit 28 (described later), and they are connected between the base of the oscillating transistor 21 and the ground (between the base and the collector in a high frequency), hence forming a Colpitts oscillator circuit.

The resonant circuit 28 has a capacitor 31 connected in parallel with a serial assembly of a capacitor 29 and a variable-capacitance diode 30. The capacitor 31 is also connected in parallel with a serial assembly of inductors 32 and 33 each being formed with a pattern. The capacitors 29 and 31 are provided for compensating a sensitivity of the variable-capacitance diode 30. The capacitor 29 operates as a direct-current cutting capacitor. The variable-capacitance diode 30 is further connected via an inductor 34 to a control port 35. Controlling a voltage applied to the control port 30 varies a capacitance of the variable-capacitance diode 30 to control a resonant frequency of the resonant circuit 28. In this embodiment, the voltage at the control port 35 ranges substantially from 0.5 V to 2.5 V, and the resonance frequency may be accordingly determined within a range of 80–100 MHz. Reference numeral 36 demotes a bypass capacitor connected between the control port 35 and the ground.

A series assembly having a capacitor 37 and a diode 38 connected in series with each other is connected between both ends of the inductor 33. The capacitor 37 and the diode 38 form first switching means (device) 38a. Reference numeral 37 denotes a direct-current cutting capacitor. The anode of the diode 38 is fed with a positive or negative voltage released via an inductor 39 from second switching means (device) 40. When receiving a positive voltage from the second switching means 40, the diode 38 is turned on to short-circuit the inductor 33 at a high frequency. That is, including an inductance with only the inductor 32, the resonant circuit 28 oscillates at a higher frequency (for example, 1850 to 1990 MHz). When receiving a negative voltage from the second switching means 40, the diode 38 is turned off to open the both ends of the inductor 33 at a high frequency. That is, including an inductance with the inductors 32 and 33 connected in series, the resonant circuit 28 oscillates at a lower frequency (for example, 1710 to 1880 MHz). The switching means 38a is not limited to the diode 38 but may be a transistor such as explained with the prior art. The transistor reduces a controlling current.

A collector of the buffer transistor 22 is coupled to a positive power source 43 (e.g. at 3.0 V) via inductors 41 and 42 which are formed with patterns and connected in series. Reference numeral 44 denotes a bypass capacitor connected between the positive power source 43 and the ground. Between both ends of the inductor 42, a capacitor 45, a diode 46, and a capacitor 70 are connected in series in this order, thus forming third switching means. The inductor 41 has a length of a ¼ wavelength of a higher output frequency. And the composite pattern of the inductors 41 and 42 has a length of a ¼ wavelength of a lower output frequency. The capacitors 45 and 70 are direct-current cutting capacitors. The anode of the diode 46 is coupled via a inductor 71 formed with a pattern to the switching means 40 for receiving a positive or negative voltage. The cathode of the diode 46 is coupled via a inductor 72 formed with a pattern to the ground. The inductors 71 and 72 are alternative-current cutting inductors. By receiving a negative voltage but not a ground potential, the diode 46 is turned on and off securely.

When receiving a positive voltage from the switching means 40, the diode 46 is turned on to short-circuit the inductor 42. This allows the buffer transistor 22 to be load with only the inductor 41, and hence allows the transistor to release an oscillation energy at the higher output frequency efficiently. Alternatively, when receiving a negative voltage from the switching means 40, the diode 46 is turned off to open the both ends of the inductor 42. This allows the buffer transistor 22 to be loaded with the serial assembly of the inductors 41 and 42, and hence allows the transistor to release an oscillation energy at a lower output frequency efficiently. The ratio of the higher frequency to the lower frequency is substantially not greater than 1.3 provides the substantially same result even if the buffer transistor 22 has a constant impedance at the collector.

The collector of the buffer transistor 22 is coupled via an output circuit 47 to a port 49 on a package 48. The port 49 is coupled via a capacitor 50 to a first output port 52 of the multi-band voltage-controlled oscillator 51. The first output port 52 releases signals for a DCS (the European mobile telephone system employing a 1800 MHz band) and a PCS (the U.S. mobile telephone system employing a 1900 MHz band). When a positive output is received from the switching means 40, the signal having a higher frequency within 1850 to 1900 MHz for the PCS is released. When a negative output is received from the switching means 40, the signal having a lower frequency within 1710 to 1880 MHz for the PCS is released. Reference numeral 48 denotes the package including a semiconductor integrated circuit mounted in the package. Reference numeral 51 denotes the multi-band voltage-controlled oscillator according to Embodiment 1 of the present invention.

Reference numeral 53 denotes a port connected to the positive power source 43 for energizing each circuit in the package 48 as well as one end of the switching means 40. The port 53 is coupled via a switch 54 and resistors 55, 56, and 57, which are connected in series with one another in this order, to the ground. The connected point of the resistors 55 and 56 is connected to the base of the buffer transistor 22 for supplying a bias voltage. Similarly, the connected point of the resistors 56 and 57 is connected to the base of the oscillating transistor 21 for supplying a bias voltage. Reference numeral 58 denotes a capacitor connected between the base of the buffer transistor 22 and the ground for actuating the buffer transistor 22 in a base common mode. The transistors 21 and 22 are both NPN transistors.

According to Embodiment 1, the oscillator includes another oscillator circuit oscillating at another frequency. The another oscillator circuit provides a signal within 880 to 960 MHz for a GSM (the European mobile telephone system) and outputs the signal from a second port 52a. The components and functions identical to those for the DCS/PCS oscillator circuit are denoted by reference numeral with a subscript "a" for simplifying the description.

The oscillation frequency is determined by a parallel circuit including an inductor 32a, capacitor 31a, and variable-capacitance diode 30a. A voltage applied to a control port 35 varies a capacitance of the variable-capacitance diode 30a to determine the resonant frequency. An inductor is formed with a pattern having a length of substantially ¼ the wavelength of the output frequency within 880 to 960 MHz for the GSM, and thus, releasing an oscillation energy to a second output port 52a efficiently.

The outputs for the DCS/PCS and the GSM are logically-added and released to a port 59 on the package 48. The sum signal at the port 59 is transferred via a capacitor 60 to a port 61. A signal from the port 61 is further transferred to a comparison input port of a PLL circuit. The PLL circuit may be formed in the package 48. That reduces an overall size of the multi-band voltage-controlled oscillator.

The outputs for the DCS/PCS and GSM are logically-added with the output circuit 47 and received by a negative source generator 67 to generate a negative power source. The negative power source is input to the other port of the switching means 40. A common port is coupled via a port 68 on the package 48 to diodes 38 and 46.

Reference numerals 62 and 63 denote ports, for receiving oscillation frequency switching signals from the outside, coupled to ports 64 and 65 on the package 48, respectively. The signals are transferred to a mode switching circuit 66 for controlling the switching means 40, the switch 54, and a switch 54a. When the DCS is selected with the switching signals, the switch 54 is turned on for a DCS/PCS operation, and the switch 54a is turned off. Simultaneously, the switching means 40 is switched to the negative power source for a DCS operation. Each diodes 38 and 46 is turned off to open both ends of each the inductors 33 and 42. When the PCS is selected with the switching signals, the switch 54 is turned on to enable the DCS/PCS operation, and the switch 54a is turned off. The switching means 40 is switched to the positive voltage for a PCS operation. The diodes 38 and 46 are turned on to short-circuit the inductors 33 and 42, respectively. When the GSM is selected with the switching signals, the switch 54 is turned off, and the switch 54a is turned on to activate circuits for the GSM.

Since the oscillation generated in the package 48 is used for generating the negative power source, a negative voltage does not have to be input from the outside. Also, since the switching means 40 switched between the negative and positive power sources, the package it can output both, positive and negative, voltages despite the single port 68 on the package 48. As the positive power source is connected with the port 53, no particular port is necessary.

In this embodiment, the ratio of the first frequency for the DCS to the second frequency for the PCS both released from the first output port 52 via the frequency switching is substantially 1.1. The ratio of the first frequency to the third frequency for the GSN released from the second output port 52a is substantially 2.0. As the first frequency and the second frequency both released from the first output port 52 are substantially equal to each other, frequency sensitivities for the frequencies of the variable-capacitance diode 30 forming the first oscillator circuit are substantially equal. Therefore, it is unnecessary to switch frequency sensitivities corresponding to a frequency band to be used, as explained later in Embodiment 2. In FIG. 1, reference numerals 50a, 58a, 23a, 24a, 25a, 27a, 29a, and 36a denote capacitors, reference numerals 72, 55a, 56a, 57a, and 34a denote inductors, reference numeral 53 denotes a port, and reference numerals 21a and 22a denote transistors.

Embodiment 2

Figure 2:
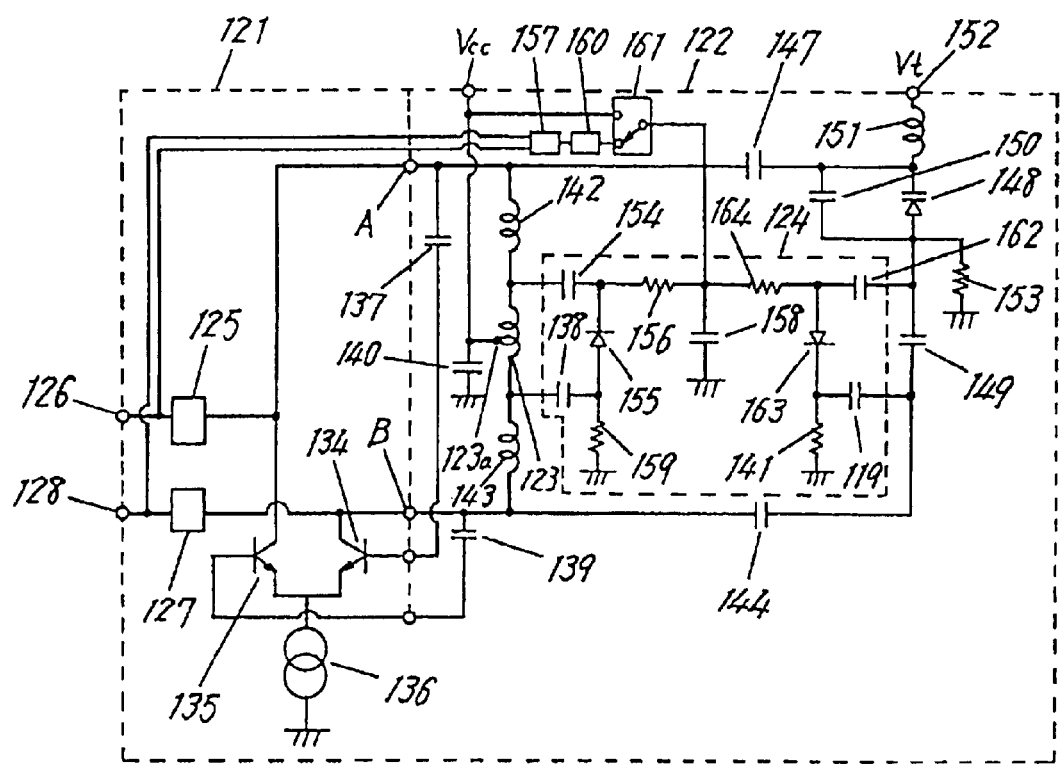
FIG. 2 is a circuit diagram of a multi-band voltage-controlled oscillator according to Embodiment 2 of the present invention.

A balanced-type oscillator according to Embodiment 2 of the present invention will be described with reference to the relevant drawings. FIG. 2 is a circuit diagram of a multi-band voltage-controlled oscillator according to the present invention. A resonant circuit 122 consisting mainly of inductors and capacitors is connected between one port A and another port B of a balanced amplifier 121 composed of transistors. Switching means 124 is connected between both ends of an inductor 123 in the resonant circuit 122. The port A is coupled to an output port 126 via a buffer circuit 125 composed of transistors. The other port B is coupled via a buffer circuit 127 composed of transistors to an output port 128. The buffer circuits 125 and 127 are identical to each other. The transistors in the circuits may be FETs.

In the balanced amplifier 121, a power source Vcc connected to a intermediate point 123a of the inductor 123 is coupled via one half of the inductor 123 and an inductor 142 to a collector of a transistor 135. The power source is also coupled via the other half of the inductor 123 and an inductor 143 to a collector of a transistor 134. Emitters of the transistors 134 and 135 are connected to each other and coupled via a constant current source 136 to the ground. A base of the transistor 134 is coupled via a capacitor 137 to the collector of the transistor 135 and to the port A. Similarly, a base of the transistor 135 is coupled via a capacitor 139 to the collector of the transistor 134 and to the port B. Reference numeral 140 denotes a bypass capacitor connected between the power source Vcc and the ground.

The resonant circuit 122 has an inductor and a capacitor connected in parallel with each other between the ports A and B. The inductor is implemented by the inductor 142 formed with a pattern, the inductor 123 formed with a pattern, and the inductor 143 formed with a pattern which are connected in this order. The inductors 142 and 143 has the same inductance used for an oscillation at a high frequency band, for example, a 1800 MHz band. The inductors 142 and 143 connected in series with the inductor 123 are used for an oscillation at a low frequency band, for example, a 900 MHz band.

The inductors 142 and 143 may be combined to a single inductor for reducing a mounting area.

The capacitor in the resonant circuit 122 is implemented by a capacitor 147 for adjusting a frequency sensitivity at the low band, a variable-capacitance diode 148, a capacitor 149 for adjusting a frequency sensitivity at the high band, and a capacitor 144 for cutting off a direct-current which are connected in this order. At both ends of the variable-capacitance diode 148, a capacitor 150 for compensating a for a frequency sensitivity of the diode is connected. A cathode of the variable-capacitance diode 148 is coupled via an inductor 151 (which may be a resistor) to a control port 152. The capacitor 147 also operates for cutting off a direct current.

A control voltage applied to the control port 152 makes a current flow through the inductor 151, the variable-capacitance diode 148, and a resistor 153, and develops a voltage between both ends of the variable-capacitance diode 148. Changing the voltage applied to the control port 152 varies the voltage applied to the variable-capacitance diode 148, thus varying a capacitance of the variable-capacitance diode 148.

Reference numeral 124 denotes the switching means having a capacitor 154, a diode 155, and a capacitor 138 which are connected in this order between both ends of the inductor 123. A connected point between the capacitor 154 and a cathode of the diode 155 is coupled via a resistor 156 to a common port of a switching circuit 161 and coupled via a capacitor 158 to the ground. The connected point between the capacitor 138 and an anode of the diode 155 is coupled via a resistor 159 to the ground.

A capacitor 162, a diode 163, and a capacitor 119 are connected in series in this order between both ends of the capacitor 149. A connected point between the capacitor 162 and an anode of the diode 163 is coupled via a resistor 164 to the common port of the switching circuit 161. A connected point between the capacitor 119 and a cathode of the diode 163 is coupled via a resistor 141 to the ground. The capacitor 158 is a bypass capacitor. The capacitors 154, 138, 162, and 119 are for cutting off a direct current.

The capacitor 149 connected in parallel with the diode 163 is connected in series with the variable-capacitance diode 148 in this embodiment. This allows the frequency sensitivity of the diode 163 to be identical at both the low and high frequency bands even if the capacitor is connected in parallel with the variable-capacitance diode 148.

An oscillation output, after passing through the buffers 125 and 127, are input via a balanced/unbalanced converter 157 to a negative source generator 160. The negative source generator 160 is connected to one end of a negative source output switching circuit 161 of which the other end is connected to the positive power source Vcc. The transistors 134 and 135, the constant current source 136, the buffers 125 and 127, the negative source generator 160, and the switching circuit 161 may be integrated in a single package.

The switching circuit 161 composed of semiconductors is turned on and off with the negative source generated from a part of an output energy of the oscillator and the positive source from the outside. Therefore, the diodes 155 and 163 can be turned on and off securely. And thus, fluctuations of a oscillation frequency and temperature characteristics of a oscillation level due to faulty turning on and off of the diodes 155 and 163 can be reduced. Also, the negative power source is developed in the package and does not have to be introduced from the outside. As the negative source is generated from the oscillation frequency of the oscillator in the package, no oscillator for the negative power source is required.

In the multi-band voltage-controlled oscillator of this embodiment, when the switching circuit 161 is switched to the positive source, the diode 155 open (is turned off), and the diode 163 is short-circuited (turned on). An equivalent circuit to this case is shown in FIG. 3.

Figure 3:
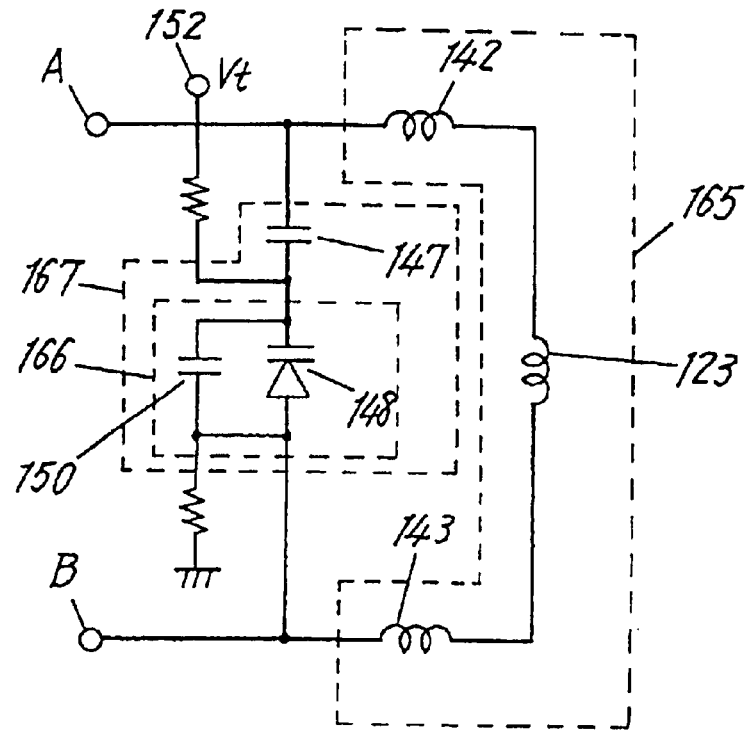
FIG. 3 is an equivalent circuit diagram of a resonant circuit when switching means in the oscillator opens.
Figure 5:
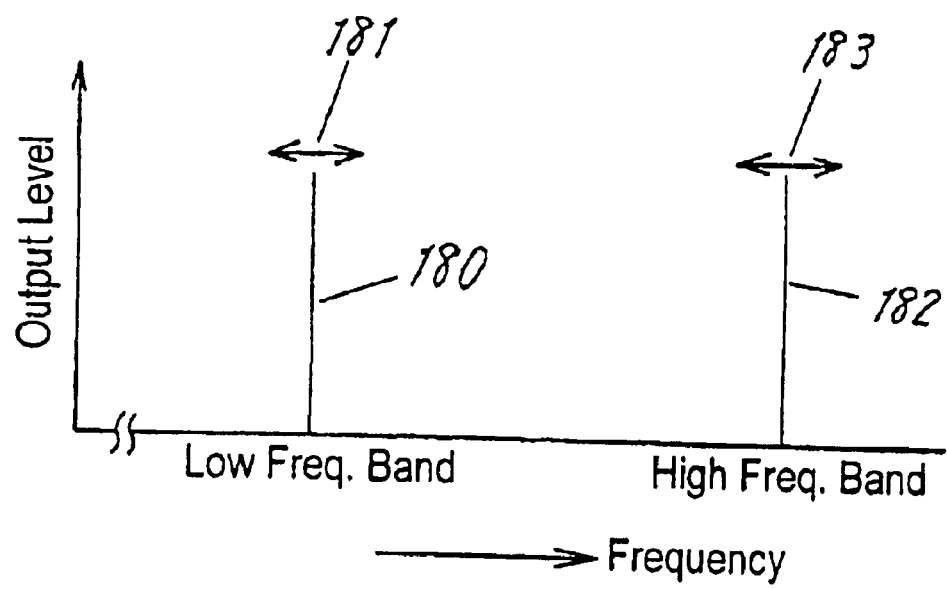
FIG. 5 is an explanatory diagram of frequency bands.

In FIG. 3, a series assembly 165 includes the inductors 142, 123, and 143 connected in series, a parallel assembly 166 includes the capacitor 150 and the variable-capacitance diode 148 connected in parallel, and a serial assembly 167 includes the parallel assembly 166 and the capacitor 147 connected in series. An impedance between the ports A and B is determined by a parallel connection of the serial assemblies 165 and 167. A resonant frequency of the impedance is determined as a parallel resonant frequency of the serial assembly 165 as an inductance and the serial assembly 167 as a capacitance. Changing the control voltage at the control port 152 varies the frequency at the low band. The frequency in the low band is substantially 900 MHz denoted by reference numeral 180 in FIG. 5 and can thus be varied throughout a range of 80 MHz denoted by reference numeral 181. In FIG. 5, the horizontal axis represents an frequency while the vertical axis represents an output level.

When the switching circuit 161 shown in FIG. 2 is switched to the negative source, the diode 155 is turned on, and the diode 163 is turned off. An equivalent circuit to this case is shown in FIG. 4.

Figure 4:
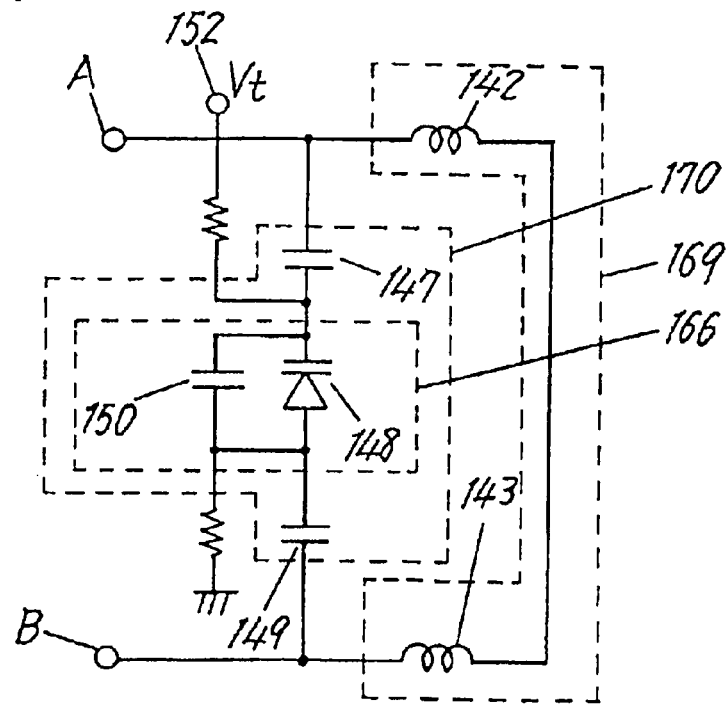
FIG. 4 is an equivalent circuit diagram of a resonant circuit when the switching means in the oscillator closes.

In FIG. 4, a serial assembly 169 includes the inductors 142 and 143 connected in series, a parallel assembly 166 includes the capacitor 150 and the variable-capacitance diode 148 connected in parallel, and a serial assembly 170 includes the parallel assembly 166 and with the capacitors 147 and 149 connected in series. An impedance between the ports A and B is determined by a parallel connection of the serial assemblies 169 and 170. A resonant frequency of the impedance is determined as a parallel resonant frequency of the serial assembly 169 as an inductance and the serial assembly 170 as a capacitance. Changing a control voltage at the control port 152 varies the frequency in the high band. The frequency in the high band is substantially 1800 MHz denoted by reference numeral 182 in FIG. 5, and can be varied throughout a range of 170 MHz denoted by reference numeral 183. In FIG. 5, the horizontal axis represents a frequency while the vertical axis represents an output level.

The low band for the GSM is about 900 MHz, and that for an AMPS (the U.S. mobile telephone system) is about 800 MHz (824–894 MHz). The high band for the DCS is about 1800 MHz, and that for the PCS is about 1900 MHz (1850–1990 MHz).

Figure 6:
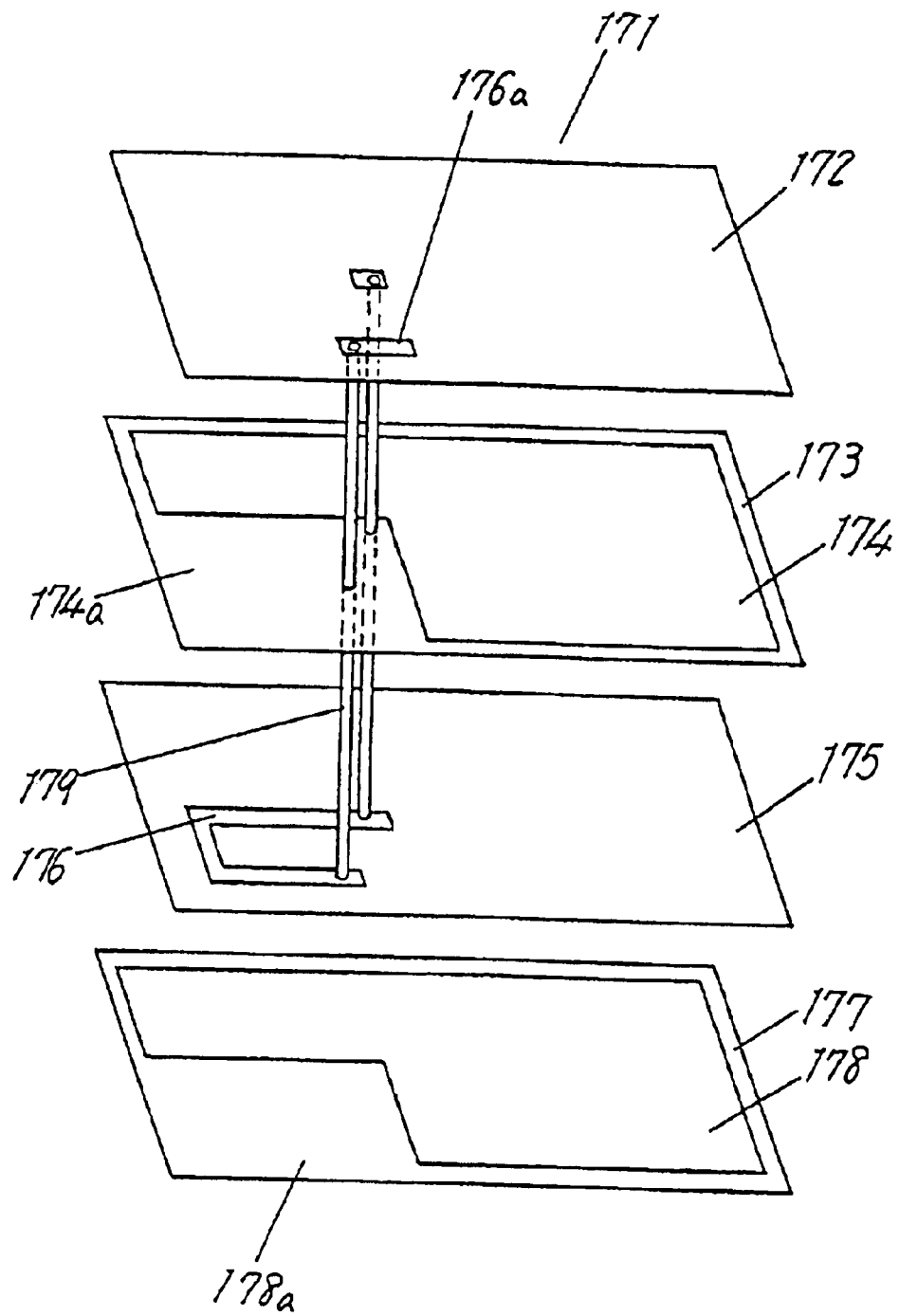
FIG. 6 is an exploded perspective view of a multi-layer substrate.
Figure 7:
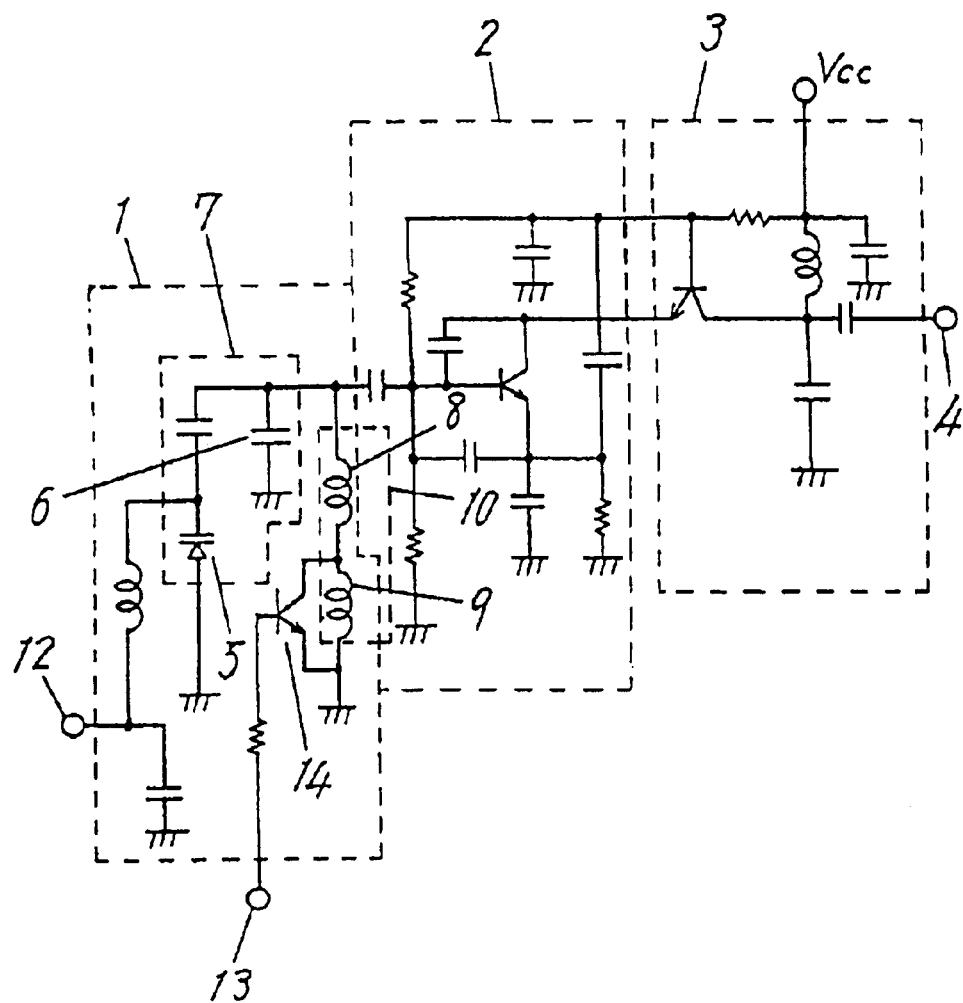
FIG. 7 is a circuit diagram of a conventional oscillator used in a mobile communication terminal.

FIG. 6 is an exploded perspective view of a multi-layer substrate 171 used in the multi-band voltage-controlled oscillator of the present invention. In FIG. 6, reference numeral 172 denotes a first layer of the multi-layer substrate 171 on which electronic components are mounted. Reference numeral 173 denotes a second layer having a grounding pattern 174 provided on one of the surfaces. Reference numeral 175 denotes a third layer having an inductor 176 formed with a pattern on one of the surfaces. Reference numeral 177 denotes a fourth layer having a grounding pattern 178 provided on one of the surfaces.

Reference numeral 176a denotes a part of the inductor 176 extending through a via-hole 172 (a through hole formed in an internal layer) to the first layer 172. An inductance of the part 176a is substantially $\frac{1}{10}$ the inductance of the inductor 176. The inductor 176 partially exposed on the surface of the multi-layer substrate 171 has the inductance controlled easily.

The grounding pattern 174 on the second layer 173 above the inductor 176 has a pattern-unformed portion 174a for increasing a Q factor of the inductor 176. Similarly, the grounding pattern 178 on the fourth layer 177 beneath the inductor 176 has a pattern-unformed portion 178a for increasing the Q factor of the inductor 176.

Most of the inductor is formed in the multi-layer substrate 171 has the overall arrangement reduced. The inductor 176 is formed with a pattern, thus having an inductance hardly varied even with a vibration. Therefore, the multi-band voltage-controlled oscillator can exhibit a high performance for a mobile communication terminal.

The arrangement of the inductor 176 and the part 176a may be applicable to the inductors 123, 142, and 143 shown in FIG. 2.

As explained above, in the multi-band voltage-controlled oscillator of this embodiment, a negative source is generated from an oscillation output and selectively supplied to the diodes 155 and 163 with the switching circuit 161. Therefore, the diodes 155 and 163 are turned on and off securely. Independently including the capacitor 147 for adjusting the sensitivity for the frequency in the low band and the capacitor 149 for adjusting that in the high band, the oscillator has the sensitivities in the low and high bands separately controlled and set identical to each other.

The oscillator includes the balanced oscillator which allows constant current to flow at the power source Vcc and which is prevented from interference between another circuit. The voltage-controller oscillator, which intends to be complicated with employing higher frequencies and having more functions improved in the versatility, can be provided in the same installing area as that for the conventional one in a mobile communication terminal.

Each of the inductors 142 and 143 has substantially the same inductance, and the inductor 123 is connected between them. Consequently, the intermediate point 123a of the inductor 123 coupled to the switching means 124 is connected with the source Vcc, and the inductors 142 and 143 are connected at both ends of the inductor 123, respectively. This can reduce an influence of the switching means 124 and maintain a balance in the resonant circuit.

A frequency in the high band can independently be adjusted by short-circuiting the inductor 123 with the diode 155 to trim the inductor 142 or 143. Then, a frequency in the low band can independently adjusted by opening the diode 155 to trim the inductor 123.

The variable-capacitance diode 148, being connected in parallel with the capacitor 150, has a frequency sensitivity compensated easily.

As circuits are integrated in a package, the oscillator has a reduced size while including other relevant circuits integrated therein, for example, an LNA and MIX.

INDUSTRIAL APPLICABILITY

As set forth above, the multi-band voltage controlled oscillator of the present invention includes the negative source generator coupled to an output of the buffer transistor, the second switching means for selectively switching an output of the negative source generator and the positive source, and the mode switching means receiving an output frequency switching signal from the outside. At least the oscillating transistor, the buffer transistor, the negative source generator, and the mode switching circuit are integrated into a signal package. An output of the second switching means controls the opening and short-circuiting operation of the first switching means to selectively release an oscillation output in a low frequency band and a high frequency band. The switching means composed of a semiconductor can certainly be turned on and off with the negative source generated from the output of the oscillator and the positive source input from the outside. That stabilizes an oscillation frequency and thermal characteristics of the oscillation level, which largely depend on the switching operation of the switching means.

As the negative source is generated in the package, the source does not have to be supplied from the outside.

As the negative source uses an oscillation frequency generated by the oscillator in the package, another oscillator is not necessary.

As the positive source and the negative source are selected by the mode switching circuit in the package, the oscillator requires a single output port thus having a reduced number of pins on the package.

What is claimed is:

1. A multi-band, voltage-controlled oscillator comprising:
   an oscillating transistor;
   a resonant circuit coupled between a base and a collector of said oscillating transistor, said resonant circuit including an inductor and a capacitor coupled in parallel with each other, wherein said inductor comprises a serial assembly having a first inductor and a second inductor coupled in series with each other, and said capacitor comprises a variable-capacitance diode;
   a buffer transistor coupled to an output of said oscillating transistor;
   a first output port coupled to an output of said buffer transistor;
   a control port adapted to supply a control voltage to said variable-capacitance diode;
   a first switching device operable to selectively open and short-circuit both ends of said second inductor;
   a negative source generator coupled to the output of said buffer transistor;
   a second switching device operable to selectively switch switching between an output of said negative source generator and a positive source;
   a mode switching circuit adapted to receive an output frequency switching signal from outside said multi-band, voltage-controlled oscillator; and
   a package including said oscillating transistor, said buffer transistor, said negative source generator circuit, and said mode switching circuit integrated therein,
   wherein said second switching device issues an output to control an opening and short-circuiting operation of said first switching device to select an oscillation output at a first output frequency and an oscillation output of a second output frequency released from said first output port, the second output frequency being different from the first output frequency.

2. A multi-band, voltage-controlled oscillator according to claim 1, wherein said oscillation transistor and said resonant circuit form an unbalanced type oscillator.

3. A multi-band, voltage-controlled oscillator according to claim 1, wherein said oscillation transistor and said resonant circuit form a balanced type oscillator.

4. A multi-band, voltage-controlled oscillator according to claim 1, wherein said first switching device includes a diode.

5. A multi-band, voltage-controlled oscillator according to claim 1, wherein said first switching device includes a transistor.

6. A multi-band, voltage-controlled oscillator according to claim 1, wherein said package further includes a source port adapted to receive the positive source and supply the positive source to said second switching device.

7. A multi-band, voltage-controlled oscillator comprising:
   an oscillating transistor;
   a resonant circuit coupled between a base and a collector of said oscillating transistor, said resonant circuit including an inductor and a capacitor connected in parallel with each other, said inductor comprising a serial assembly having a first inductor and a second inductor coupled in series with each other, and said capacitor comprising a variable-capacitance diode;
   a buffer transistor coupled to an output of said oscillating transistor;
   a first output port coupled to an output of said buffer transistor;
   a control port adapted to supply a control voltage to said variable-capacitance diode;
   a first switching device operable to selectively open and short-circuit both ends of said second inductor;
   a negative source generator coupled to an output of said buffer transistor;
   a second switching device operable to selectively switch between an output of said negative source generator and a positive source, and release an output to control an opening and short-circuiting operation of said first switching device to select between an oscillation output at a first output frequency and an oscillation output at a second output frequency released from said first output port, the second output frequency being higher than the first output frequency;
   a mode switching circuit adapted to receive an output frequency switching signal received from outside of said multi-band, voltage-controlled oscillator;
   a package including said oscillating transistor, said buffer transistor, said negative source generator, and said mode switching circuit integrated therein;
   a third inductor and a fourth inductor coupled in series with each other and between a collector of said buffer transistor and a source, each of said third and fourth inductors being formed with a pattern;
   a third switching device operable to selectively open and short-circuit both ends of said fourth inductor according to an output of said second switching device,
   wherein said third inductor has a length of substantially ¼ wavelength of the second output frequency, and a composite pattern of said third and fourth inductors has a length of substantially ¼ wavelength of the first output frequency.

8. A multi-band, voltage-controlled oscillator comprising:
a first oscillating transistor;
a resonant circuit coupled between a base and a collector of said first oscillating transistor, said resonant circuit having a first inductor and a first capacitor coupled in parallel with each other, said first inductor comprising a serial assembly having a second inductor and third inductor coupled in series with each other, and said first capacitor comprising a first variable-capacitance diode;
a first buffer transistor coupled to an output of said first oscillating transistor;
a first switching device operable to selectively open and short-circuit both ends of said second inductor;
a negative source generator coupled to an output of said first buffer transistor;
a second switching device operable to selectively switch between an output of said negative source generator and a positive source, and release an output to control an opening and short-circuiting operation of said first switching device to select between an oscillation output at a first output frequency and an oscillation output at a second output frequency released from said first buffer transistor, the second output frequency being higher than the first output frequency;
a mode switching circuit adapted to receive an output frequency switching signal from outside of said multi-band, voltage-controlled oscillator;
a second oscillation transistor;
a parallel assembly coupled between a base and a collector of said second oscillating transistor, said parallel assembly having a fourth inductor and a second capacitor coupled in parallel with each other, said second capacitor comprising a second variable-capacitance diode;
a second buffer transistor coupled to an output of said second oscillation transistor;
a control port adapted to supply a control voltage to said first and second variable-capacitance diodes; and
a package including said first and second oscillating transistors, said first and second buffer transistors, said negative source generator, and said mode switching circuit integrated therein,
wherein said mode switching circuit, according to the output frequency switching signal from outside of said multi-band, voltage controlled oscillator, selects between an output from said first buffer transistor and an output from said second buffer transistor.

9. A multi-band, voltage-controlled oscillator according to claim 8,
wherein a ratio of the second output frequency to the first output frequency is not greater than 1.2, and
wherein a ratio of a third frequency from said second buffer transistor to the first frequency is not smaller than 1.5.

10. A multi-band, voltage-controlled oscillator according to claim 8,
wherein an oscillating operation of said second oscillating transistor is turned off when an output is released from said first buffer transistor, and
wherein an oscillating operation of said first oscillating transistor is turned off when an output is released from said second buffer transistor.

11. A multi-band, voltage-controlled oscillator according to claim 8, further comprising a logical adder circuit operable to calculate a logical addition of outputs of said first and second buffer transistors.

12. A multi-band, voltage-controlled oscillator according to claim 10, further comprising a PLL circuit coupled to an output of said logical adder circuit, said PLL circuit being integrated in said package.

13. A multi-band, voltage-controlled oscillator comprising:
an oscillating transistor;
a resonant circuit coupled between a base and a collector of said oscillating transistor, said resonant circuit having an inductor and a capacitor coupled in parallel with each other, said inductor comprising a series assembly having a first inductor and a second inductor, and said capacitor comprising a variable-capacitance diode;
a buffer transistor coupled to an output of said oscillating transistor;
a first output port coupled to an output of said buffer transistor;
a control port adapted to supply a control voltage to said variable-capacitance diode;
a first switching device operable to selectively open and short-circuit both ends of said second inductor;
a negative source generator coupled to an output of said buffer transistor;
a second switching device operable to selectively switch between an output of said negative source generator and a positive source, and release an output to control an opening and short-circuiting operation of said first switching device to select between an oscillation output at a first output frequency and an oscillation output at a second output frequency released from said first output port, the second output frequency being higher than the first output frequency;
a mode switching circuit adapted to receive an output frequency switching signal from outside of said multi-band, voltage-controlled oscillator;
a package including said oscillating transistor, said buffer transistor, said negative source generator, and said mode switching circuit integrated therein;
a first capacitor coupled with said variable-capacitance diode; and
a third switching device coupled between both ends of said first capacitor,
wherein said third switching device is operable to substantially equalize frequency sensitivities at the first and second output frequencies by an opening and short-circuiting operation thereof.

14. A multi-band, voltage-controlled oscillator according to claim 13, further comprising a second capacitor, wherein an assembly having said variable-capacitance diode and first capacitor is coupled in series with said second capacitor.

15. A multi-band, voltage-controlled oscillator according to claim 13, further comprising a second capacitor, wherein said first inductor is divided into two portions, said portions each having a substantially equal inductance, and said second capacitor is coupled between said portions.

16. A multi-band, voltage-controlled oscillator according to claim 13, further comprising a second capacitor coupled in parallel with said variable-capacitance diode.

17. A multi-band, voltage-controlled oscillator according to claim 13, wherein said first and second inductors are formed with patterns.

18. A multi-band, voltage-controlled oscillator according to claim 17, wherein after trimming said first inductor to adjust the second output frequency, said second inductor is trimmed to adjust the first output frequency.

19. A multi-band, voltage-controlled oscillator according to claim 18, further comprising:
   a multi-layer substrate having said first and second inductors formed therein; and
   a grounding pattern formed at said multi-layer substrate, said grounding pattern not being formed at a portion over which at least one of said first and second inductors is formed.

20. A multi-band, voltage-controlled oscillator according to claim 18, further comprising:
   a multi-layer substrate having said first and second inductors formed therein; and
   a via-hole formed in said multi-layer substrate adapted to expose a portion of at least one of said first and second inductors to a surface of said multi-layer substrate,
   wherein at least one of the first and second output frequencies can be adjusted by trimming said portion exposed to said surface of said multi-layer substrate.

21. A multi-band, voltage-controlled oscillator according to claim 13,
   wherein said third switching device includes a first switching diode coupled between both ends of said first capacitor,
   wherein said first switching devices includes a second switching diode coupled between both ends of said second inductor, and
   wherein said package is operable to generate a voltage applied to said first and second switching diodes to control opening and short-circuiting operations of said third and first switching devices respectively.

22. A multi-band, voltage-controlled oscillator according to claim 13, wherein said first inductor is a single inductor.

23. A multi-band, voltage-controlled oscillator according to claim 1, wherein said first switching device comprises a semiconductor device.

24. A multi-band, voltage-controlled oscillator according to claim 7, wherein said first switching device comprises semiconductor devices.

25. A multi-band, voltage-controlled oscillator according to claim 8, wherein said first switching device comprises semiconductor devices.

26. A multi-band, voltage-controlled oscillator according to claim 13, wherein said first switching device comprises a semiconductor device.

27. A multi-band, voltage-controlled oscillator according to claim 13, wherein said first capacitor is coupled in parallel with said variable-capacitance diode.

28. A multi-band, voltage-controlled oscillator according to claim 13, wherein said first capacitor is coupled in series with said variable-capacitance diode.

* * * * *

UNITED STATES PATENT AND TRADEMARK OFFICE
CERTIFICATE OF CORRECTION

PATENT NO.    : 6,759,915 B2
DATED         : July 6, 2004
INVENTOR(S)   : Terumoto Akatsuka It is certified that error appears in the above-identified patent and that said Letters Patent is hereby corrected as shown below:

Title page,
Item [57], ABSTRACT,
Line 2, replace "certainly be turned" with -- certainly turned --.
Line 11, replace "of first" with -- of a first --.

Column 14,
Line 12, replace "devices respectively." with -- devices, respectively. --.

Signed and Sealed this

Thirtieth Day of November, 2004

JON W. DUDAS
*Director of the United States Patent and Trademark Office*